Feb. 2, 1971 R. Q. MacLEAY ET AL 3,560,891

REFLECTION PHASE SHIFTER UTILIZING MIGROSTRIP DIRECTIONAL COUPLER

Filed March 24, 1969

INVENTORS.
ROBERT Q. MACLEAY
LAWRENCE R. WHICKER
BY.

ATTORNEY

United States Patent Office
3,560,891
Patented Feb. 2, 1971

3,560,891
REFLECTION PHASE SHIFTER UTILIZING MICROSTRIP DIRECTIONAL COUPLER

Robert Q. Macleay, Severna Park, and Lawrence R. Whicker, Arnold, Md., assignors to Westinghouse Electric Corporation, Pittsburgh, Pa., a corporation of Pennsylvania Filed Mar. 24, 1969, Ser. No. 809,670
Int. Cl. H01p *1/18, 5/14*
U.S. Cl. 333—31 7 Claims

ABSTRACT OF THE DISCLOSURE

Described is a reflective phase shifter, utilizing microstrip transmission lines, which allows for a continuously variable differential phase shift over a given range. The basic elements of the device are (1) a microstrip quarter-wavelength parallel-line directional coupler formed on a semiconductive substrate and having three of its four arms of specific length and either open-ended or terminated in shorts, (2) a distributed P-N junction formed in the semiconductive substrate in the coupling region between the two parallel microstrips of the coupler and (3) an external direct current voltage source for biasing the P-N junction to change the coupling capacitance between the parallel microstrips.

CROSS-REFERENCES TO RELATED APPLICATIONS

Application Ser. No. 809,669, filed Mar. 24, 1969, and assigned to the assignee of the present application.

BACKGROUND OF THE INVENTION

With the availability of microwave transistors and other semiconductor devices usable at microwave frequencies, the microstrip transmission line has found wide application because of its compatibility with the fabrication and installation of passive components and active devices on the same substrate with the transmission line. Essentially, a microstrip transmission line consists of a strip of conductive material, corresponding to the center conductor of a coaxial transmission line, deposited on one side of a dielectric or semiconductive substrate by photoresist techniques. The opposite side of the substrate is covered with a layer of conductive material comprising a ground plane and corresponding to the outer cylindrical conductor of a coaxial transmission line. With this configuration, and assuming that a source of wave energy is applied across the strip and ground plane on opposite sides of the substrate, an electric field is established between the two.

In the past, the need for a phase shifter in integrated microstrip circuit technology has been mat by switching various lengths of microstrip transmission line into and out of the circuit. This procedure, however, is rather cumbersome in that it requires a number of switching diodes and associated individual direct current biasing networks. In addition, devices in which lengths of transmission line are switched into or out of the circuit are capabale of providing discrete changes in phase shift only.

SUMMARY OF THE INVENTION

As an overall object, the present invention seeks to provide a new and improved microstrip phase shifter which permits a continuously variable differential phase shift over a specified range without the necessity for switching diodes and associated direct current biasing networks.

More specifically, an object of the invention is to provide a reflection-type phase shifter utilizing a P-N junction, variable coupling directional coupler.

The basic element of the invention is a variable coupling, microstrip quarter-wavelength parallel-line directional coupler of the type described in copending application Ser. No. 809,669, filed Mar. 24, 1969, and assigned to the assignee of the present application. The coupler described in that application comprises microstrip transmission lines deposited, by photo-resist etching techniques, in parallel side-by-side relationship on a semiconductor substrate. The microstrip transmission lines extend parallel to each other through a distance equal to a quarter-wavelength of the wave energy to be coupled. Beneath the parallel microstrips, in the coupling region between the two, is formed a P-N junction. By applying a bias across the P-N junction and by varying that bias (forward up to the contact potential and reverse to breakdown), the depletion-layer capacitance of the junction can be varied as well as the total coupling capacitance between the parallel microstrip transmission lines.

In accordance with the present invention, the directional coupler of the aforesaid copending application is utilized to provide a reflection-type phase shifter wherein wave energy is fed into one arm of the coupler and the reflected energy of that arm is shifted in phase by an amount dependent upon the lengths of the other arms and the type of termination in each arm. Furthermore, by varying the bias across the P-N junction in the coupling region between the parallel microstrip transmission lines of the coupler, the phase shift between the incident and reflected wave energy can be made to vary also.

The above and other objects and features of the invention will become apparent from the following detailed description taken in connection with the accompanying drawings which form a part of this specification, and in which.

Figures 1, 2:
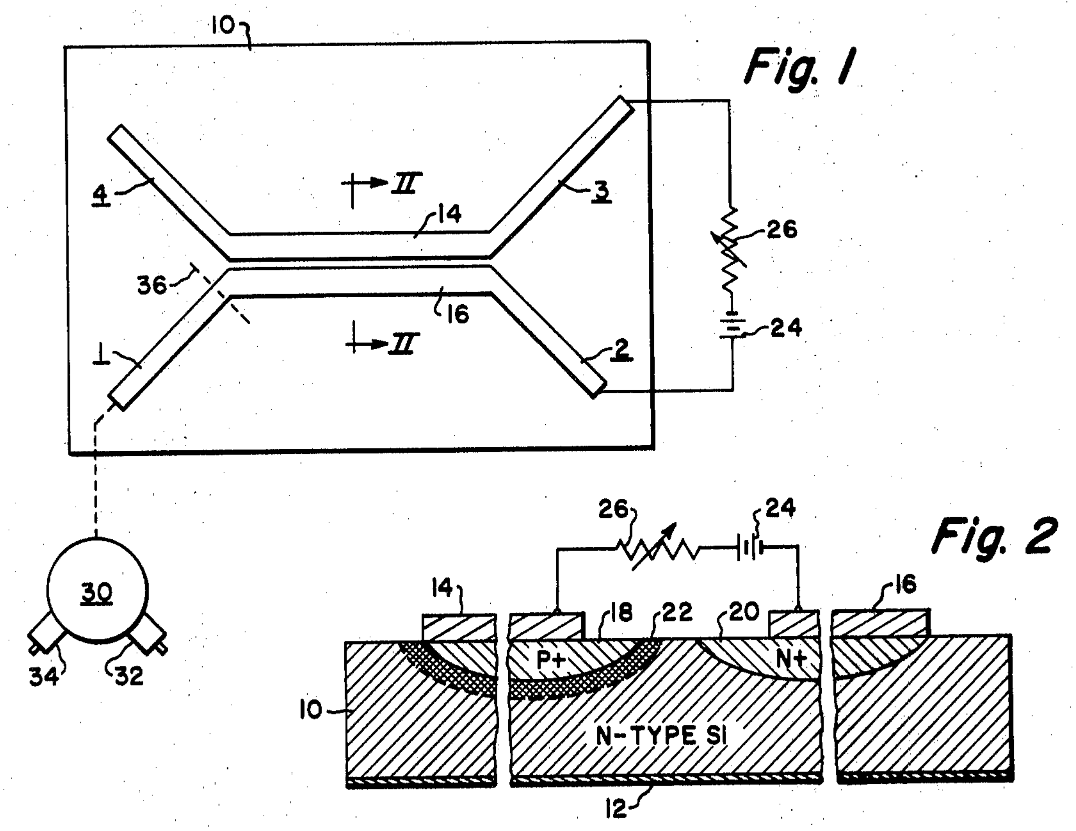
FIG. 1 is a top view of a semiconductor wafer having microstrip transmission lines deposited thereon and forming the reflective phase shifter of the present invention.
FIG. 2 is a cross-sectional view taken substantially along line II—II of FIG. 1.

With reference now to the drawings, and particularly to FIGS. 1 and 2, the embodiment of the invention shown comprises a wafer 1 of semiconductive material, such as N-type silicon, having its lower surface covered with a layer of metal 12 forming a ground plane. Deposited on the surface of the wafer 10, by photoresist etching techniques, are parallel strip conductors 14 and 16 which terminate in arms identified as 1, 2, 3 and 4. The length of the parallel strip conductors 14 and 16 is equal to a quarter-wavelength of the wave energy which is to be coupled.

Diffused into the N-type silicon wafer 10 beneath the strip 14 is a P-type region 18. Similarly, a heavily doped N-type region 20 is diffused into the wafer 10 beneath strip 16, the two regions 18 and 20 being separated. Surrounding the P-type region 18 is a depletion layer 22 depleted of current carriers, and in which the space-charge of the positive donors, on one hand, and the negative acceptors, on the other hand, is not compensated. The system, therefore, resembles a parallel-plate condenser. When an external forward bias is applied across the two regions 18 and 20, as by way of battery 24 and variable resistor 26, the depletion region or layer increases in width, and the capacitance across the layer increases. Similarly, if a reverse bias is applied across the regions 18 and 20, the width of the depletion layer increases, and the capacitance decreases. In either case, forward or reverse bias, the capacitance can be varied as by means of the variable resistor 26 or its equivalent.

A circulator 30, well known in the art, isolates input signals on coaxial transmission line 34, for example, from output signals on coaxial transmission line 32. The circulator 30 is connected to arm 1 as shown.

Suitable P-N junctions can be produced in accordance with the invention by any one of a number of methods well known to those skilled in the art. By way of specific example, a silicon substrate having vapor deposited metal lines forming a conventional quarter-wavelength, parallel-line directional coupler, can have a distributed P-N junction inserted by proper diffusion of phosphorus and boron. Suitable vapor deposited metals may comprise aluminum or silver, as an example. The diffusion geometry and diffusion profiles are selected to provide a standard surface oriented variable capacitance diode, distributed through the coupling region. It should be understood that the substrate 10 could comprise P-type silicon with equal effectiveness in which case the diffused regions would be $P+PN+$ rather than the $P+nn+$ regions shown. It will be understood, of course, that instead of using an N-type substrate, a P-type substrate could be used equally well.

The theory of a reflective, differential phase shifter is quite standard and well known. The differential phase shift produced by the device may be expressed by the quantity $b_1/a_1$, where $a_1$ is the input voltage through arm 1 at its respective reference plane 36 and $b_1$ is the output voltage in arm 1 at the reference plane 36. The ratio $b_1/a_1$ may be written in terms of the geometric configuration of the device and the coupling coefficient, $k_2$, as follows:

$$\frac{b_1}{a_1}=\frac{(T_2+T_4)k^2-T_2-T_2T_3T_4}{1+T_3T_4-(T_3T_4+T_2T_3)k^2}$$

where $T_1$, $T_2$, $T_3$ and $T_4$ are quantities involving the total phase shifts of the respective arms due to the lengths of the arms and the line losses and losses in the terminations in the arms, if any. The presence of the distributed P-N junction in the coupling region provides a means, via the applied direct current bias, of altering the coupling coefficient, $k^2$, and thus the quantity $b_1/a_1$.

As will be appreciated, in order to obtain the desired phase shift between the input and output signals, the lengths of the various arms of the phase shifter and their type of termination must be carefully chosen. An open-ended termination is one in which the arm 1, 2, 3 or 4 simply terminates on top of the substrate 10. On the other hand, in order to short a termination, it is necessary to provide an electrical connection between the end of the arm and the ground plate 12. This may be achieved, for example, by drilling a hole through the substrate and connecting the end of the arm to the ground plate 12 by means of a conductor extending through the hole.

Figure 3:
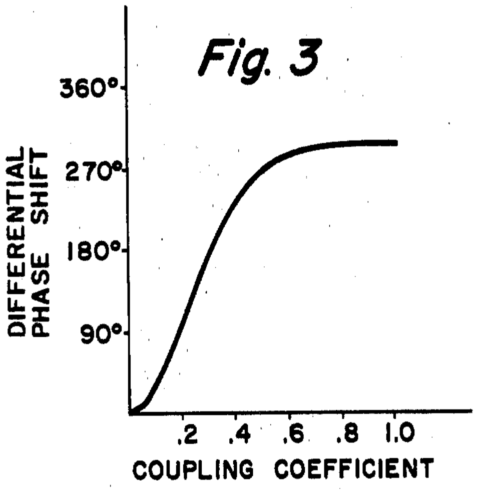
FIG. 3 is a plot of phase shift versus coupling coefficient for a typical phase shifter constructed in accordance with the teachings of the invention.

FIG. 3 illustrates a graph of phase shift as a function of the coupling coefficient, $k^2$, for a design wherein arm 2 has a length equal to a quarter-wavelength of the incident wave energy and terminates at an open end; arm 3 has a length equal to 1.30 times a quarter-wavelength and terminates at an open end; and arm 4 has a length equal to 1.62 times a quarter-wavelength and terminates at an open end. Notice that as the coupling coefficient, $k^2$, increases from 0 to about 0.5, the phase shift increases substantially linearly up to about 270°. However, as the coupling coefficient increases above 0.5, the phase shift remains substantially constant at about 290°.

Figure 4:
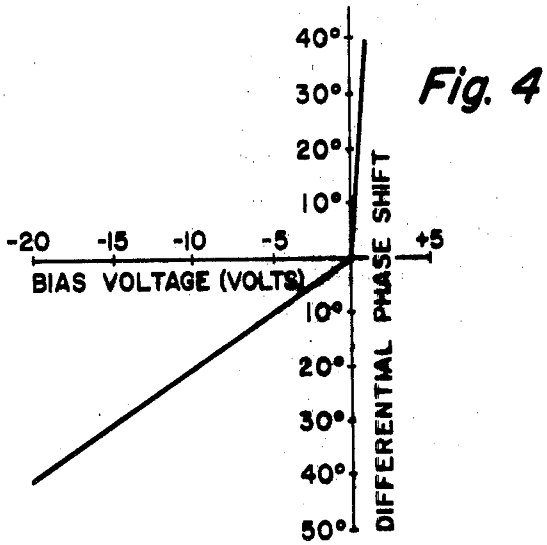
FIG. 4 is a plot of measured differential phase versus applied direct current bias for the phase shifter of FIGS. 1 and 2.

In FIG. 4, phase shift versus applied direct current bias voltage is plotted for a typical phase shifter constructed in accordance with the teachings of the invention. Note that when a negative reverse bias is applied approaching the breakdown potential, the phase shift experienced increases linearly from about 10° at minus 5 volts to about 40° at minus 20 volts. On the other hand, when a forward bias up to a contact potential of about 0.6 volt is applied, the phase shift experienced is much greater for lower voltages.

It can be seen, therefore, that the presence of the distributed P-N junction in the coupling region between the strips 14 and 16 provides a means, via the applied direct current bias, of altering the coupling coefficient, $k^2$, and thus the quantity $b_1/a_1$. Although the invention has been shown in connection with a certain specific embodiment, it will be readily apparent to those skilled in the art that various changes in form and arrangement of parts may be made to suit requirements without departing from the spirit and scope of the invention.

We claim as our invention:

1. A reflection-type phase shifter comprising a substrate of semiconductive material having deposited on one surface thereof parallel microstrip transmission lines, conductive material deposited on the other side of said substrate and forming a ground plane, a P-N junction formed in said substrate in the coupling region between said parallel transmission lines, arms of predetermined length connected to opposite ends of said parallel microstrip transmission lines, means for applying incident wave energy to one of said arms and for deriving reflected wave energy from said one arm shifted in phase with respect to the incident wave energy, and means for applying a source of biasing potential across said P-N junction whereby the total coupling capacitance between the parallel transmission lines and the phase shift of the reflected wave energy with respect to the incident wave energy will be determined by the magnitude of said source of biasing potential.

2. The phase shifter of claim 1 including means for varying said bias potential to thereby vary the phase shift between said incident and reflected wave energy.

3. The phase shifter of claim 1 wherein the microstrip transmission lines extend parallel to each other for a distance equal to a quarter-wavelength of the wave energy to be coupled.

4. The phase shifter of claim 1 wherein the P-N junction extends along the entire length of said parallel microstrip transmission lines.

5. The phase shifter of claim 1 wherein the means for applying wave energy to said one arm and for receiving reflected wave energy from said one arm comprises a microwave circulator.

6. The phase shifter of claim 1 wherein said substrate comprises N-type semiconductive material having diffused into its upper surface under one of said parallel microstrip transmission lines a P-type region and having diffused into the other of said parallel microstrip transmission lines a heavily doped N-type region, the two regions being separated by the N-type semiconductive material of said substrate.

7. The phase shifter of claim 1 wherein said substrate comprises P-type semiconductive material having diffused into its upper surface under one of said parallel microstrip transmission lines a heavily doped P-type region and having diffused into the other of said parallel microstrip transmission lines an N-type region, the two regions being separated by the P-type semiconductive material of said substrate.

References Cited

UNITED STATES PATENTS

| | | | |
|---|---|---|---|
| 3,378,738 | 4/1968 | McIver | 317—235 (21.1)UX |
| 3,400,342 | 9/1968 | Putnam | 333—10X |
| 3,416,042 | 12/1968 | Thomas et al. | 333—10UX |
| 3,432,778 | 3/1969 | Ertel | 333—81 |
| 3,475,700 | 10/1969 | Ertel | 333—31UX |
| 3,500,255 | 3/1970 | Ho et al. | 333—10 |

PAUL L. GENSLER, Primary Examiner

U.S. Cl. X.R.

317—234; 333—10, 84